(12) United States Patent
Hu et al.

(10) Patent No.: US 11,144,089 B1
(45) Date of Patent: Oct. 12, 2021

(54) ELECTRONIC DEVICE

(71) Applicants: Zung-Ting Hu, Taipei (TW);
Hsuan-Liang Lin, Taipei (TW);
Wen-Hsien Chin, Taipei (TW);
Yen-Kang Chen, Taipei (TW); Jia-Wen Chen, Taipei (TW); Cheng-Min Chen, Taipei (TW); Tze-Chiang Cheng, Taipei (TW)

(72) Inventors: Zung-Ting Hu, Taipei (TW);
Hsuan-Liang Lin, Taipei (TW);
Wen-Hsien Chin, Taipei (TW);
Yen-Kang Chen, Taipei (TW); Jia-Wen Chen, Taipei (TW); Cheng-Min Chen, Taipei (TW); Tze-Chiang Cheng, Taipei (TW)

(73) Assignee: COMPAL ELECTRONICS, INC., Taipei (TW)

( * ) Notice: Subject to any disclaimer, the term of this patent is extended or adjusted under 35 U.S.C. 154(b) by 0 days.

(21) Appl. No.: 16/904,587

(22) Filed: Jun. 18, 2020

(30) Foreign Application Priority Data

Mar. 24, 2020 (TW) .................................. 109109784

(51) Int. Cl.
*G06F 1/16* (2006.01)
*H05K 5/02* (2006.01)
*H05K 5/00* (2006.01)

(52) U.S. Cl.
CPC ......... *G06F 1/1601* (2013.01); *H05K 5/0017* (2013.01); *H05K 5/0221* (2013.01); *H05K 5/0247* (2013.01); *G06F 2200/1631* (2013.01)

(58) Field of Classification Search
None
See application file for complete search history.

(56) References Cited

U.S. PATENT DOCUMENTS

| 6,816,361 | B2 | 11/2004 | Kuo | |
|---|---|---|---|---|
| 10,114,408 | B2* | 10/2018 | Ent | G06F 1/1601 |
| 2008/0026801 | A1* | 1/2008 | Bliss | H04M 1/0266 |
| | | | | 455/575.1 |
| 2014/0085798 | A1* | 3/2014 | Myerchin | F16M 11/046 |
| | | | | 361/679.22 |

(Continued)

FOREIGN PATENT DOCUMENTS

| CN | 104536532 | 4/2015 |
|---|---|---|
| TW | I519232 | 1/2016 |
| TW | I633414 | 8/2018 |

OTHER PUBLICATIONS

"Office Action of Taiwan Counterpart Application", dated Oct. 22, 2020, p. 1-p. 4.

*Primary Examiner* — Xanthia C Cunningham
(74) *Attorney, Agent, or Firm* — JCIPRNET

(57) ABSTRACT

An electronic device including a main body, a frame and a display is provided. The frame is pivotally connected to the main body. The display is detachably assembled to the frame and configured to rotate between a first state and a second state in relative to the main body with the frame. When the display is rotated in relative to the main body to the first state, the display closes the main body. When the display is rotated in relative to the main body to the second state, the display is departed from the main body, so as to be detached from the main body and the frame.

15 Claims, 15 Drawing Sheets

(56) References Cited

U.S. PATENT DOCUMENTS

| | | | |
|---|---|---|---|
| 2015/0103483 A1* | 4/2015 | Lin ..................... | G06F 1/1632 |
| | | | 361/679.43 |
| 2016/0062399 A1* | 3/2016 | Hsu ..................... | G06F 1/1601 |
| | | | 361/679.21 |
| 2017/0006194 A1* | 1/2017 | Inaba ............... | H04N 5/225251 |
| 2020/0341515 A1* | 10/2020 | Moser ..................... | H05K 7/14 |
| 2021/0041915 A1* | 2/2021 | Moser ................... | G06F 1/1605 |

* cited by examiner

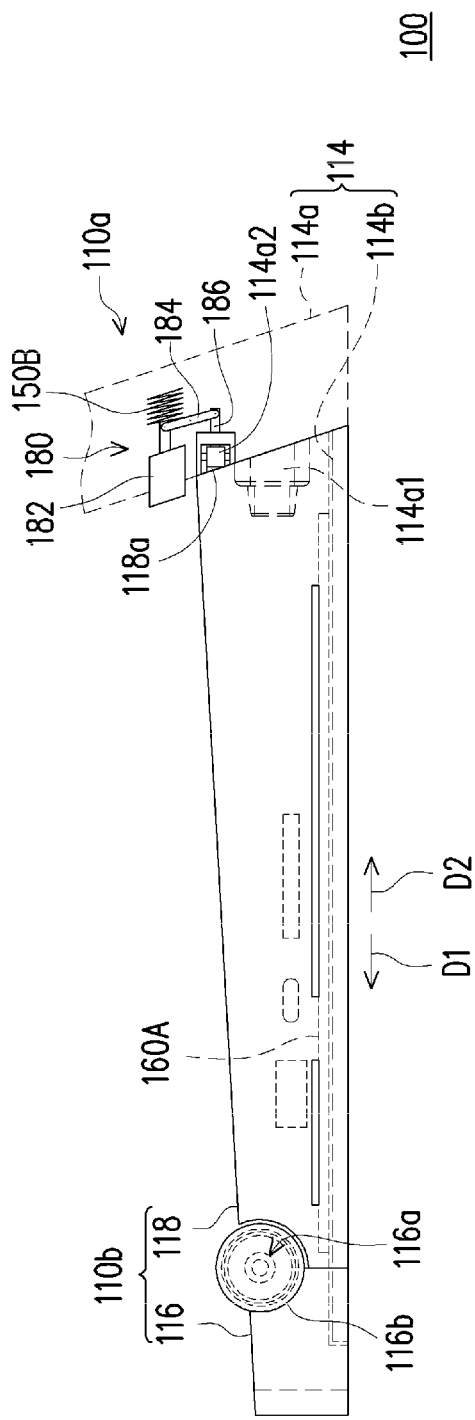
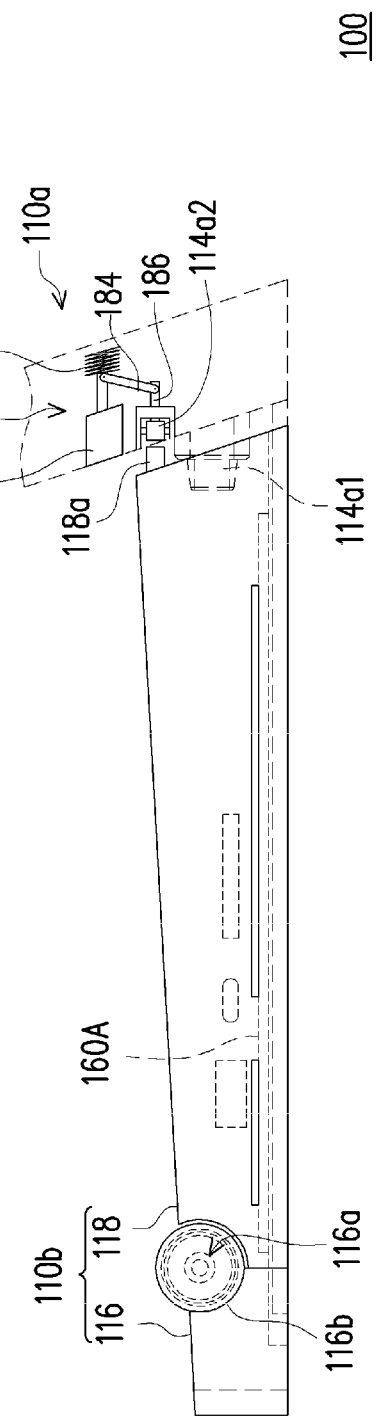
FIG. 6A
FIG. 6B

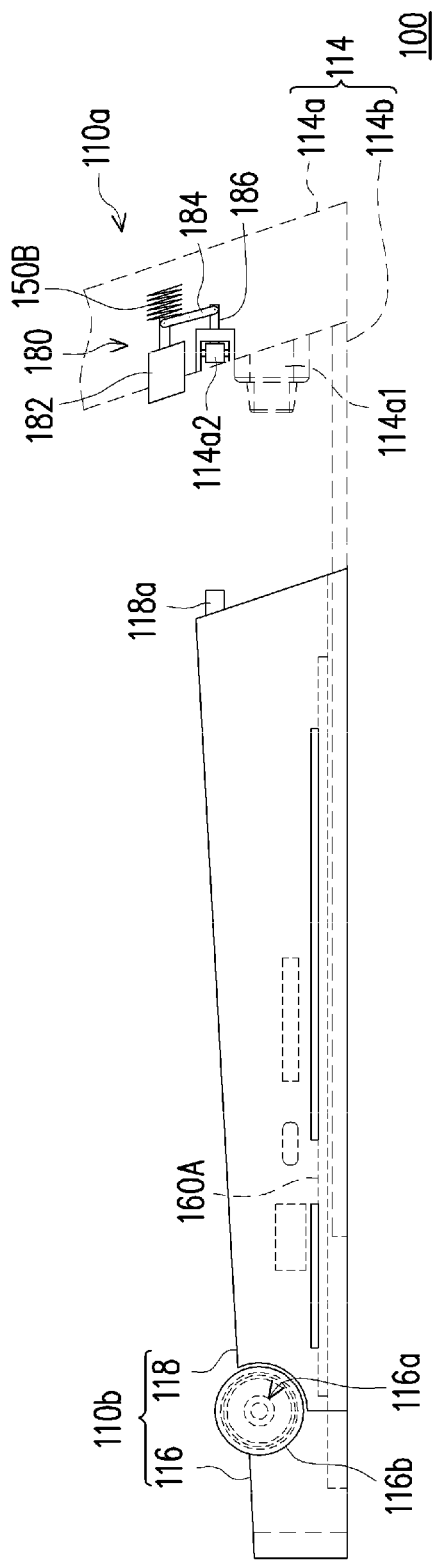
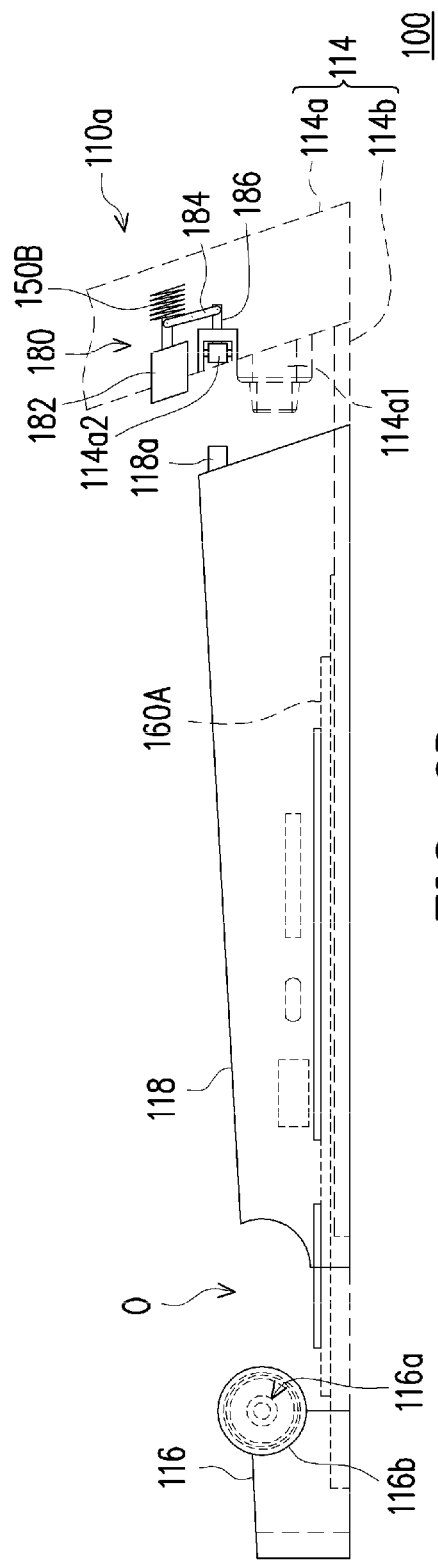
FIG. 6C
FIG. 6D

ELECTRONIC DEVICE

CROSS-REFERENCE TO RELATED APPLICATION

This application claims the priority benefit of Taiwan application serial no. 109109784, filed on Mar. 24, 2020. The entirety of the above-mentioned patent application is hereby incorporated by reference herein and made a part of this specification.

BACKGROUND

Technical Field

The present application relates to an electronic device, and particularly to an electronic device having a display.

Description of Related Art

The traditional desktop computer comprises the display and the host separated from each other, and the display and the host are electrically connected through cables, which takes up a lot of space and is not compact. As a result, an All-In-One (AIO) computer that integrates the host into the display is proposed, which not only reduces the space occupied, but also makes the appearance more compact. Most of the common AIO computers on the market having displays which cannot be easily detached from their main bodies, and it is not conducive to the replacement or repair of the display.

SUMMARY

The present application provides an electronic device, which facilitates the replacement or repair of the display.

The electronic device of the present application comprises a main body, a frame and a display. The frame is pivotally connected to the main body. The display is detachably assembled to the frame and configured to rotate between a first state and a second state in relative to the main body with the frame. When the display is rotated in relative to the main body to the first state, the display closes the main body. When the display is rotated in relative to the main body to the second state, the display is departed from the main body, so as to be detached from the main body and the frame.

In an embodiment of the present application, the display has a first assembly portion, and the frame has a second assembly portion. The first assembly portion and the second assembly portion are detachably assembled with each other. When the display is in the first state, the first assembly portion and the second assembly portion are concealed between the display and the main body. When the display is in the second state, the first assembly portion and the second assembly portion are exposed.

In an embodiment of the present application, the first assembly portion is located on a back surface of the display. When the display is in the first state, the back surface faces the main body.

In an embodiment of the present application, the display is configured to slide in relative to the frame along a sliding direction to depart from the frame, and the sliding direction is perpendicular to a pivot axis between the frame and the main body.

In an embodiment of the present application, the electronic device further comprises a locking member, wherein the locking member is disposed in the main body, the frame has an engaging portion, and when the display is in the first state, the locking member and the engaging portion are engaged with each other to limit the frame and the display to the first state.

In an embodiment of the present application, the locking member is pivotally connected to the main body, and the locking member is configured to rotate in relative to the main body, to be engaged with or departed from the engaging portion.

In an embodiment of the present application, the electronic device further comprises an elastic component disposed between the locking member and the main body. The locking member is configured to be engaged with the engaging portion by the elastic force of the elastic component, and the locking member is configured to resist against the elastic force of the elastic component and departed from the engaging portion.

In an embodiment of the present application, the display has an electrical connection portion. The electronic device comprises an electronic assembly, the electronic assembly is disposed in the main body, and the display is electrically connected to the electronic assembly through the electrical connection portion. When the display is in the first state, the electrical connection portion is concealed between the display and the main body, and when the display is in the second state, the electrical connection portion is exposed.

In an embodiment of the present application, the electronic device further comprises at least one electrical connection cable, which is connected between the electrical connection portion and the electronic assembly.

In an embodiment of the present application, the electrical connection portion is a signal and power integration slot, and the at least one electrical connection cable comprises a signal cable and a power cable.

In an embodiment of the present application, the electronic device further comprises an electronic assembly and a bracket, wherein the electronic assembly has an assembly part, the bracket is installed in the main body, and the electronic assembly is detachably mounted to the bracket through the assembly part and located in the main body.

In an embodiment of the present application, the electronic assembly is a display card.

In an embodiment of the present application, when the display is in the first state, the bracket is concealed between the display and the main body, and when the display is in the second state, the bracket is exposed.

In an embodiment of the present application, the main body comprises a main casing and a base. The main casing is supported on the base, and the display is rotatably connected to the main casing. In addition, the electronic device comprises another electronic assembly, and the two electronic assemblies are located in the main casing and the base, respectively.

In an embodiment of the present application, the electronic device is an AIO computer.

Based on the above, in the electronic device of the present application, the display can be detached from the main body after being rotated to a specific state. Thus, the convenience of replacing or repairing the display can be improved.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

FIG. 6A to FIG. 6D are operation flowcharts of the second casing part of FIG. 1.

DESCRIPTION OF THE EMBODIMENTS

Figure 1:
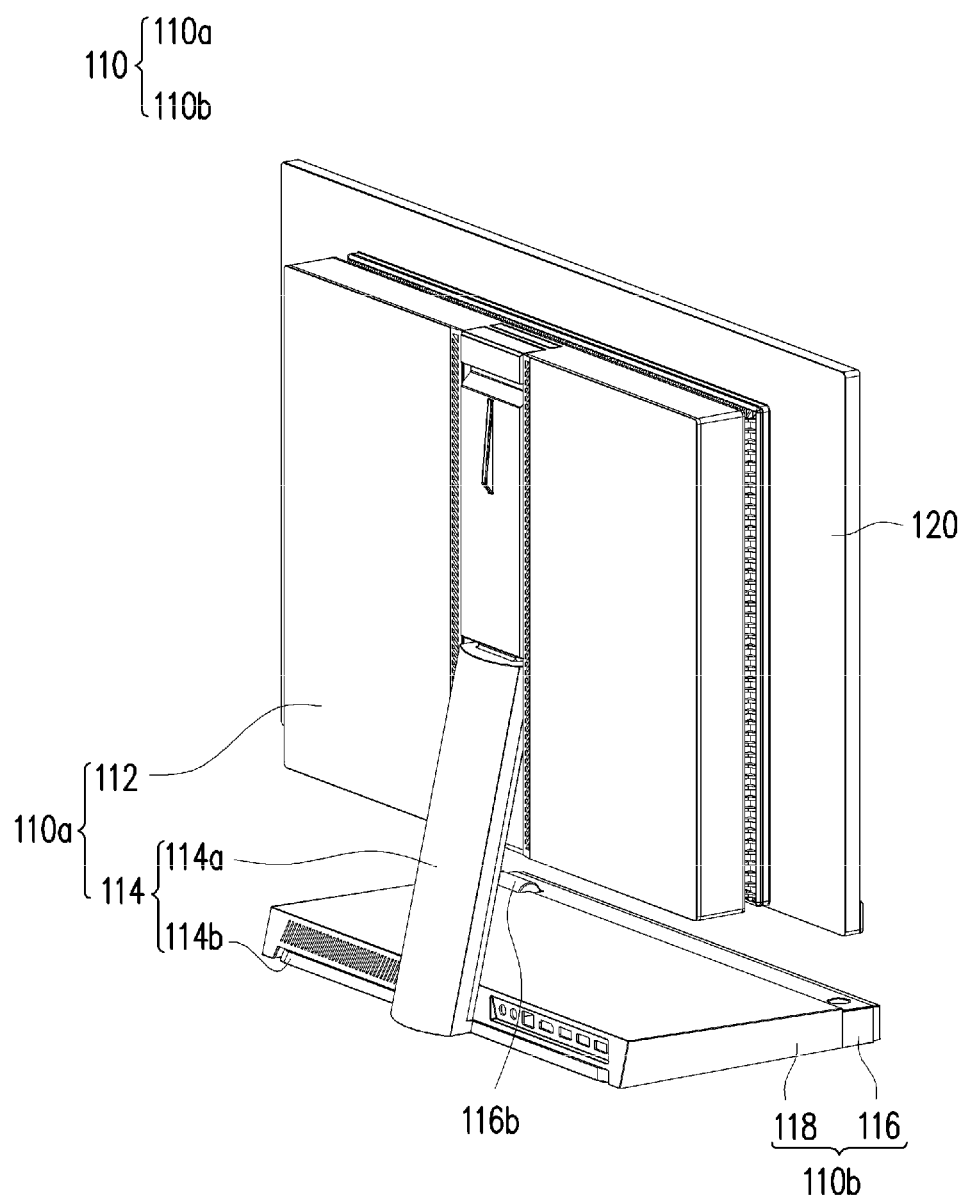
FIG. 1 is a perspective view of an electronic device according to an embodiment of the application.
Figure 2:
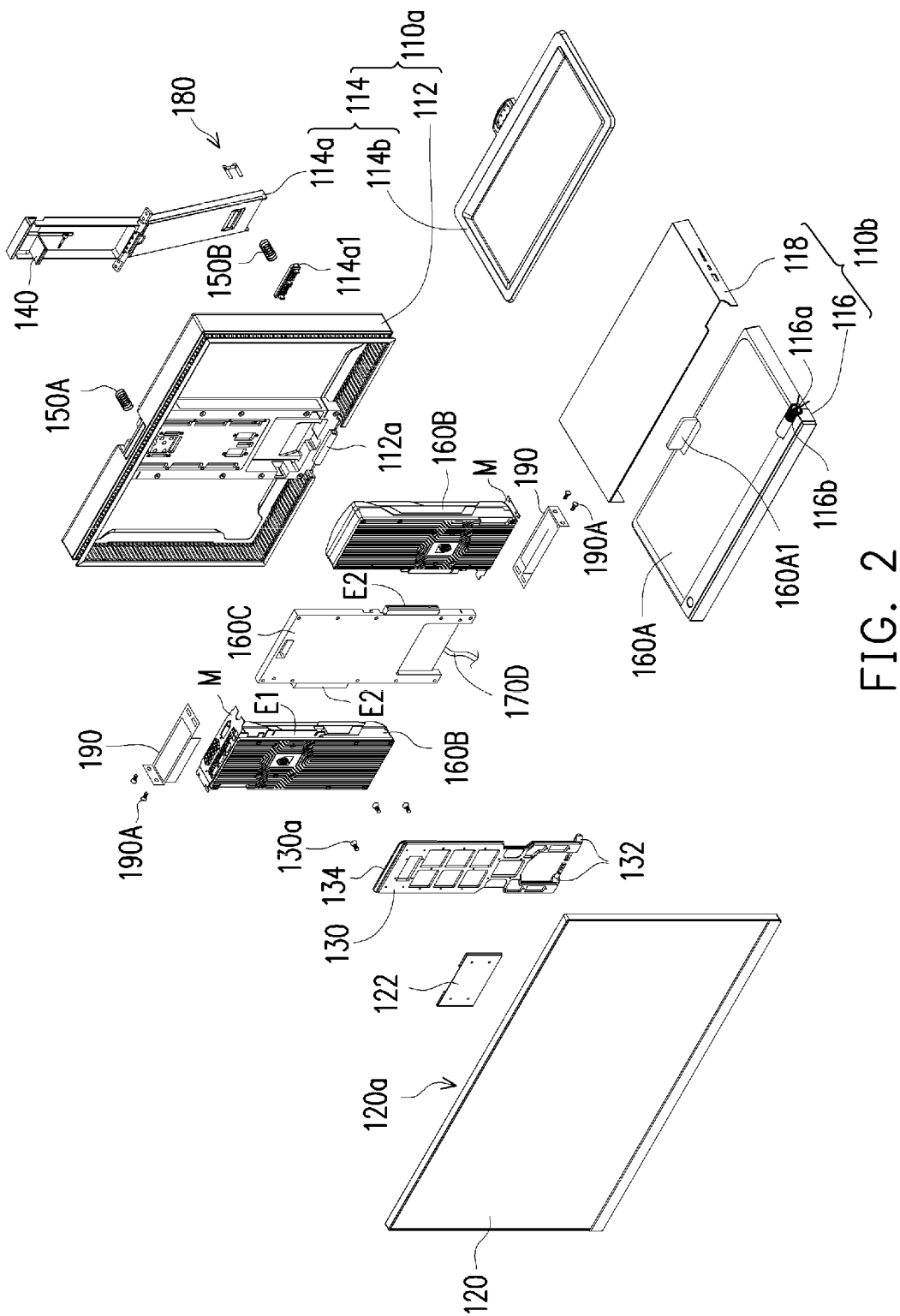
FIG. 2 is an exploded view of the electronic device of FIG. 1.

FIG. 1 is a perspective view of an electronic device according to an embodiment of the application. FIG. 2 is an exploded view of the electronic device of FIG. 1. Referring to FIG. 1 and FIG. 2, the electronic device 100 of this embodiment is, for example, an AIO computer and includes a main body 110 and a display 120. The main body 110 includes a first casing part 110a and a second casing part 110b, the first casing part 110a includes a main casing 112 and a stand 114, and the second casing part 110b is a base. The stand 114 includes a based portion 114b and an extended portion 114a connected to each other. The based portion 114b is connected to the second casing part 110b, and the extended portion 114a extends upward from the based portion 114b and connects the main casing 112. That is, the stand 114 is connected between the second casing part 110b and the main casing 112 so that the main casing 112 is supported on the second casing part 110b. The display 120 is disposed on the main casing 112 of the first casing part 110a.

FIG. 3A to FIG. 3F show the disassembly flow of the display of FIG. 1. In the present embodiment, the display 120 is rotatably connected to the main casing 112 along the rotation axis A (marked in FIGS. 3A to 3F). When the display 120 rotates in relative to the main casing 112 to a first state shown in FIG. 3A, the display 120 closes the main casing 112, and when the display 120 rotates in relative to the main casing 112 to a second state shown in FIG. 3D, the display 120 is departed from the main casing 112 so as to be removed from the main casing 112. That is, by rotating the display 120 in relative to the main casing 112 to a specific state (i.e., the second state described above), the display 120 can be readily removed from the main casing 112. By doing so, the convenience of replacing or repairing the display 120 is enhanced, allowing users to easily replace displays with different screen sizes or specifications or send the display 120 for repair as needed.

Figure 3A:
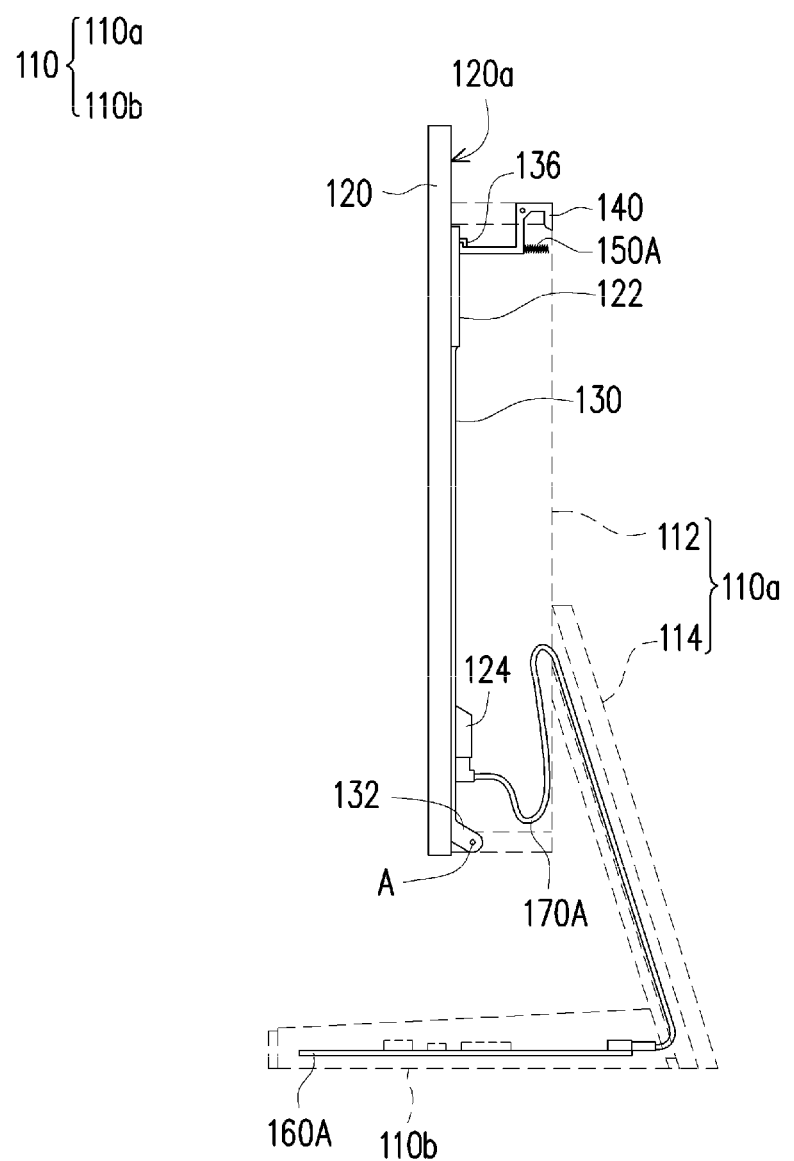
FIG. 3A to FIG. 3F show the disassembly flow of the display of FIG. 1.

In detail, the electronic device 100 of the present embodiment includes a frame 130 as shown in FIGS. 2 and 3A. The display 120 is rotatably connected to the main casing 112 by the frame 130. Specifically, the frame 130 has a pivoting portion 132 pivotally connected to the pivoting portion 112a of the main casing 112 along the rotation axis A. The display 120 is detachably mounted to the frame 130 and can be rotated with the frame 130 between the first state and the second state. The display 120 has a first assembly portion 122 on its back surface 120a, the frame 130 has a second assembly portion 134, and the first assembly portion 122 and the second assembly portion 134 are detachably assembled with each other by, for example, the fasteners 130a (e.g., screws).

In addition, the electronic device 100 includes a locking member 140 and an elastic component 150A. The locking member 140 is pivotally connected to the main casing 112. The elastic component 150A is, for example, a spring and is disposed between the locking member 140 and the main casing 112. The frame 130 has an engaging portion 136 (shown in FIG. 3A to FIG. 3F), which corresponds to the locking member 140. When the display 120 is in the first state shown in FIG. 3A, the locking member 140 is locked to the engaging portion 136 by the elastic force of the elastic component 150A, so as to limit the frame 130 and the display 120 to the first state. In the present embodiment, the locking member 140 and the engaging portion 136 are, for example, in the form of hooks and are suitable for engaging with each other. However, the present application is not limited thereto, and may be other forms of structures suitable for mutual locking.

On the other hand, the electronic device 100 includes an electronic assembly 160A and at least one electrical connection cable (an electrical connection cable 170A is schematically illustrated in FIG. 3A). The display 120 has an electrical connection portion 124 (as shown in FIG. 3A). The electrical connection portion 124 is disposed on the back surface 120a of the display 120. The electronic assembly 160A is, for example, a motherboard and is disposed in the second casing part 110b, and the electrical connection cable 170A is connected between the electrical connection portion 124 and the electronic assembly 160A. That is, the display 120 is electrically connected to the electronic assembly 160A through the electrical connection portion 124 and the electrical connection cable 170A.

As mentioned above, when the display 120 is in the first state shown in FIG. 3A, the back surface 120a of the display 120 and the first assembly portion 122 thereon face the main casing 112, and the first assembly portion 122, the second assembly portion 134, and the fasteners 130a are concealed between the display 120 and the main casing 112, to prevent the appearance of the electronic device 100 from being affected by the exposure of the first assembly portion 122, the second assembly portion 134, the fasteners 130a, and the electrical connection portion 124, and to prevent the electrical connection cable 170A from unwantedly loosening from the electrical connection portion 124 due to external force.

Figure 3B:
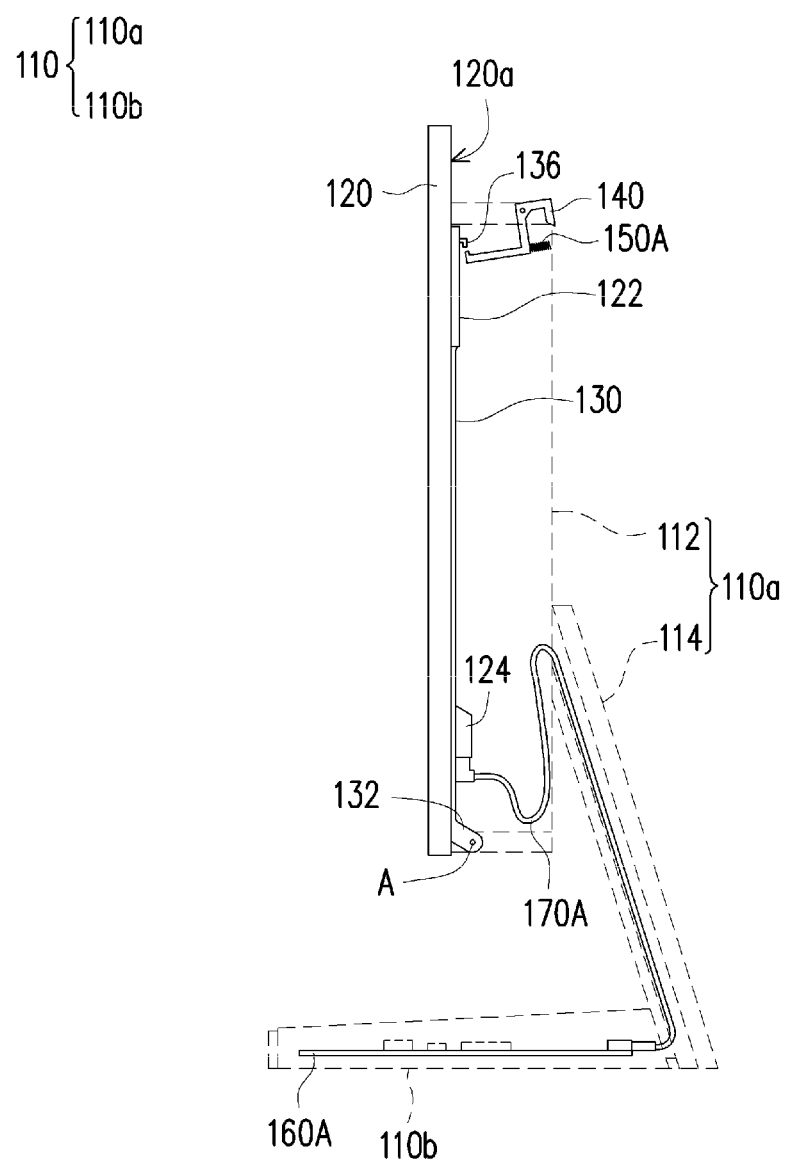
Figure 3C:
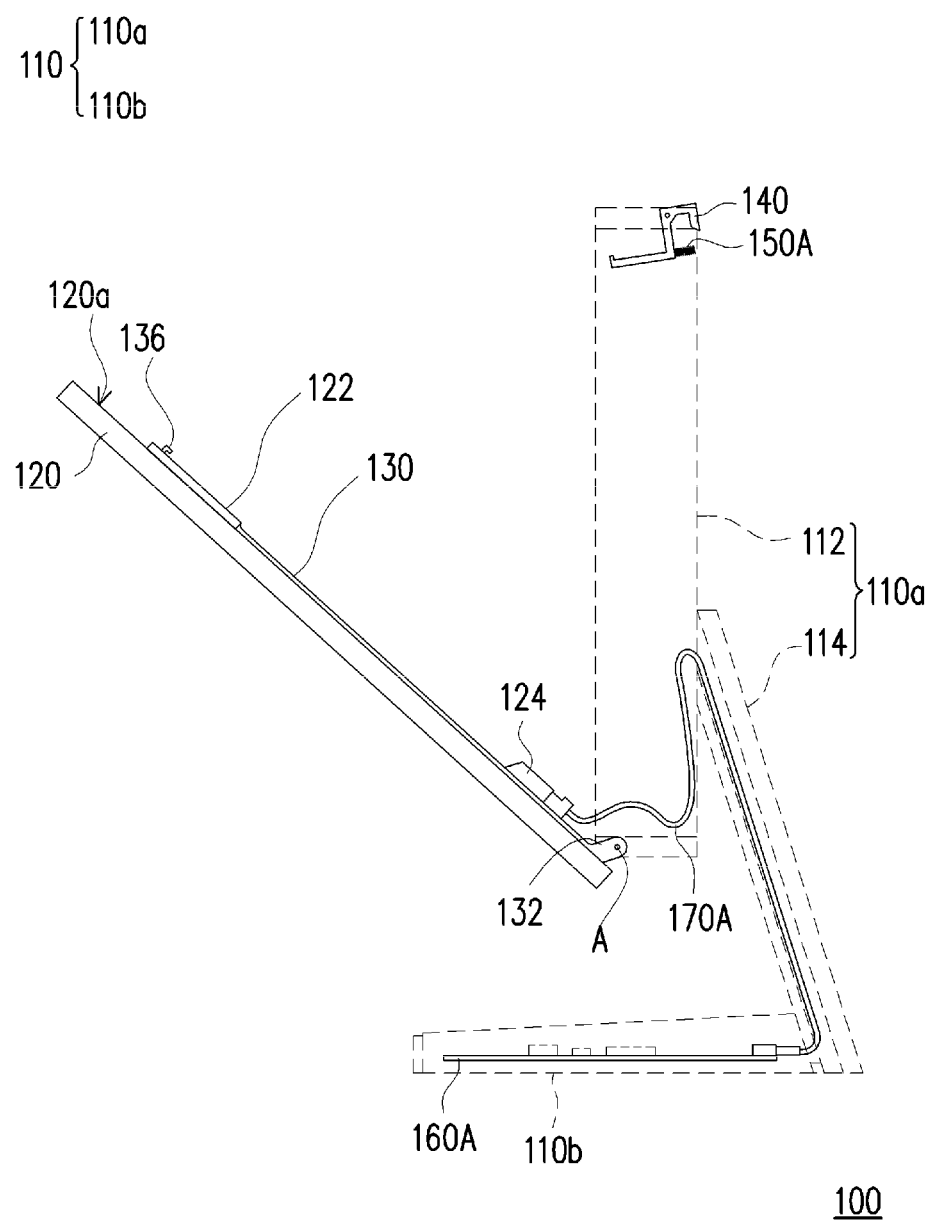
Figure 3D:
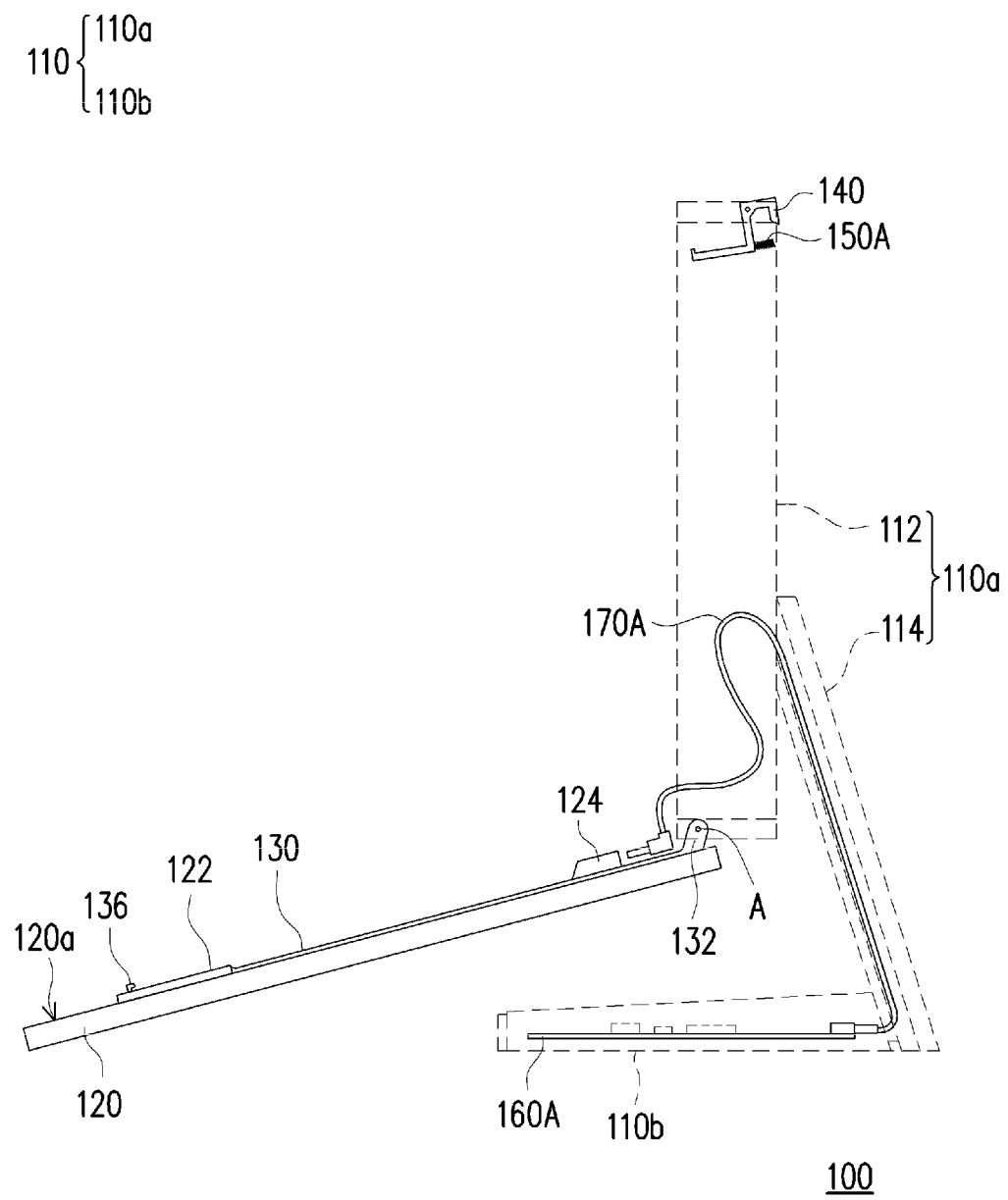
Figure 3E:
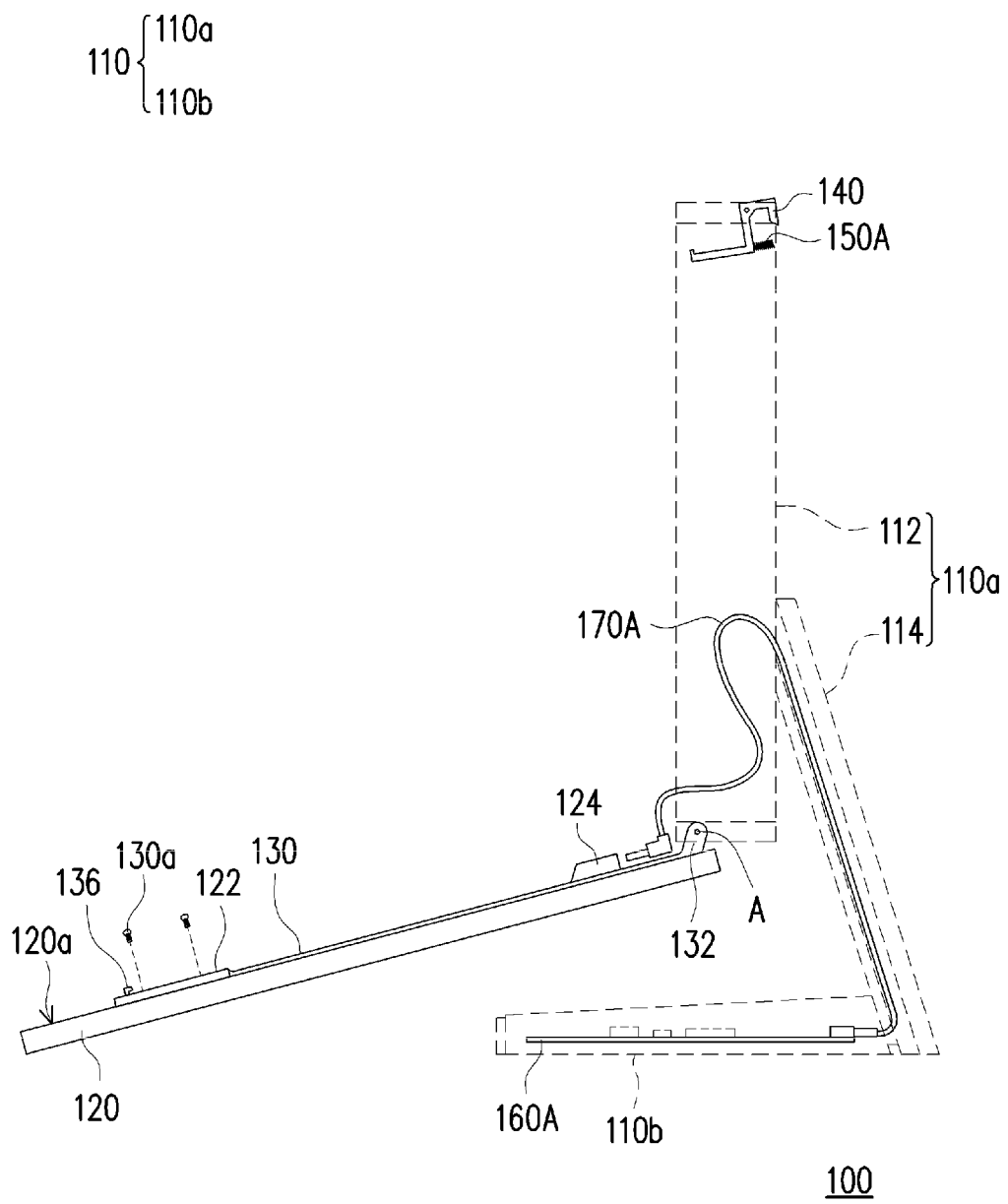

Referring to FIG. 3A to FIG. 3B, when the user wants to detach the display 120, the user can apply force to the locking member 140 to make it resist against the elastic force of the elastic component 150A to rotate in relative to the main casing 112 and disengage from the engaging portion 136. The frame 130 and the display 120 are no longer restricted to the first state. Then, referring to FIG. 3B to FIG. 3D, the user can apply force to rotate the display 120 to the second state and expose the first assembly portion 122, the second assembly portion 134, and the fasteners 130a (shown in FIG. 2 and FIG. 3E) and the electrical connection portion 124. After that, the user can unplug the electrical connection cable 170A from the electrical connection portion 124 as shown in FIG. 3D and remove the fasteners 130a on the first assembly portion 122 and the second assembly portion 134 as shown in FIG. 3E. Then, referring to FIG. 3F, the user can apply force to the display 120, so as to slide the display 120 in relative to the frame 130 along a sliding direction D perpendicular to the pivot axis (i.e., the rotation axis A) between the frame 130 and the main casing 112, and the display 120 can be departed from the frame 130, so as to detach the display 120 from the main body 110 and the frame 130.

Figure 3F:
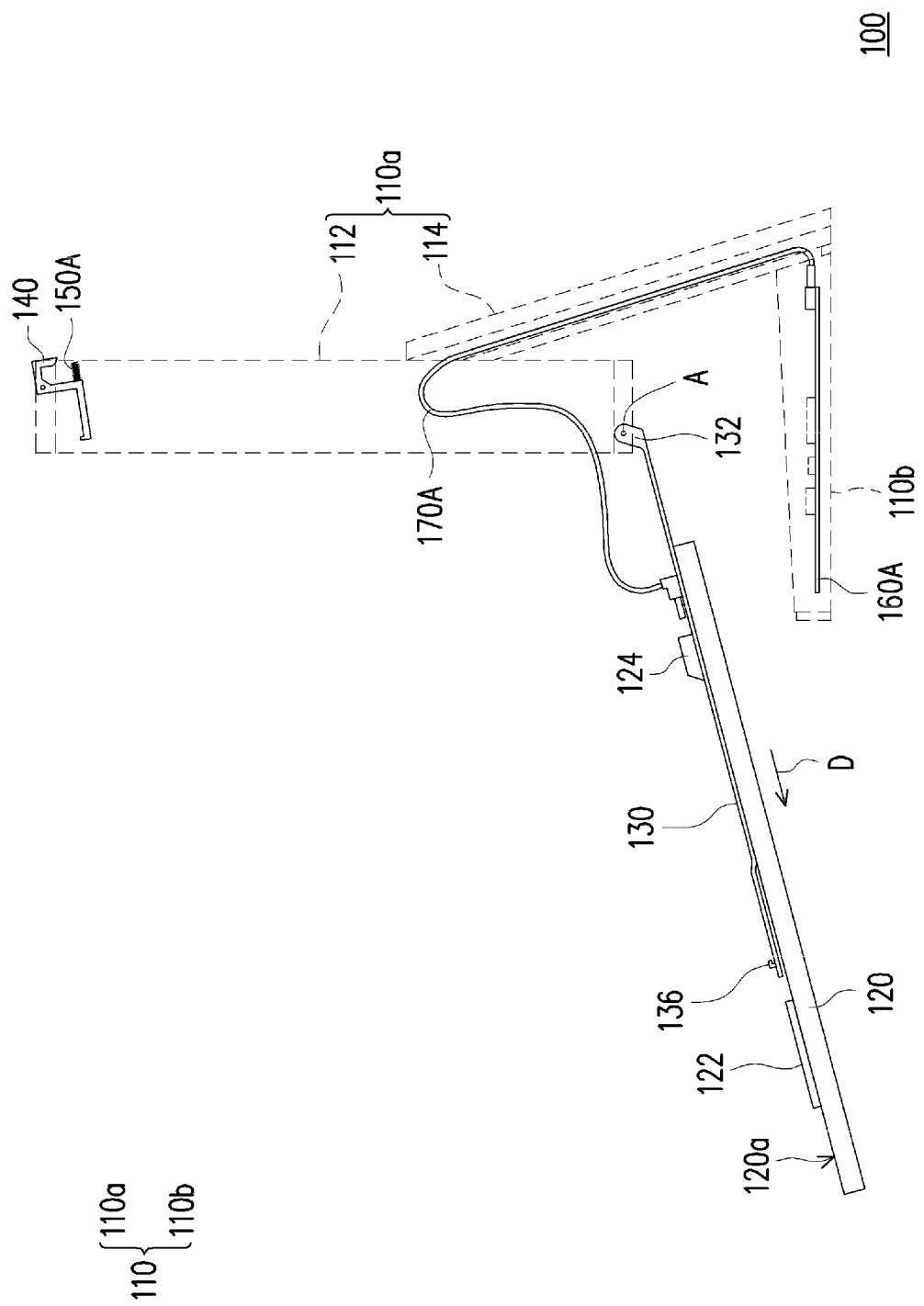

When the user wants to install the repaired display 120 or another display to the main casing 112, the display can be slid in relative to the frame 130 in a direction opposite to the sliding direction D as shown in FIG. 3F to FIG. 3E and mounted to the frame body 130. And then, as shown in FIG. 3E to FIG. 3D, the first assembly portion 122 is fastened to the second assembly portion 134 by the fasteners 130a. Then, the electrical connection cable 170A is plugged into the electrical connection portion 124, and the display 120 is rotated to the first state as shown in FIG. 3D to FIG. 3B. After that, the locking member 140 can engaged with the engaging portion 136 by the elastic force of the elastic component 150A, as shown in FIG. 3A, to accomplish the installation of the display 120.

Referring to FIG. 2, the electronic device 100 of the present embodiment includes at least another electronic assembly 160B (shown as two) and at least one bracket 190 (shown as two). When the display 120 is in the first state shown in FIG. 3A, the brackets 190 is concealed between the display 120 and the main casing 112, and when the display 120 is in the second state shown in FIG. 3D, the bracket 190 is exposed. Two electronic assemblies 160B, for example, the main display card and the auxiliary display card, are installed in the main casing 112 by two brackets 190, respectively. In detail, each electronic assembly 160B has an assembling part M, which is, for example, a metal piece in standard specification disposed on various display cards, and the bracket 190 is a component corresponding to the metal piece in standard specification and installed in the main casing 112. Thus, display cards in various specifications (such as the electronic assemblies 160B) can be detachably mounted to the bracket 190 by its assembling part M in standard specification.

Figure 4:
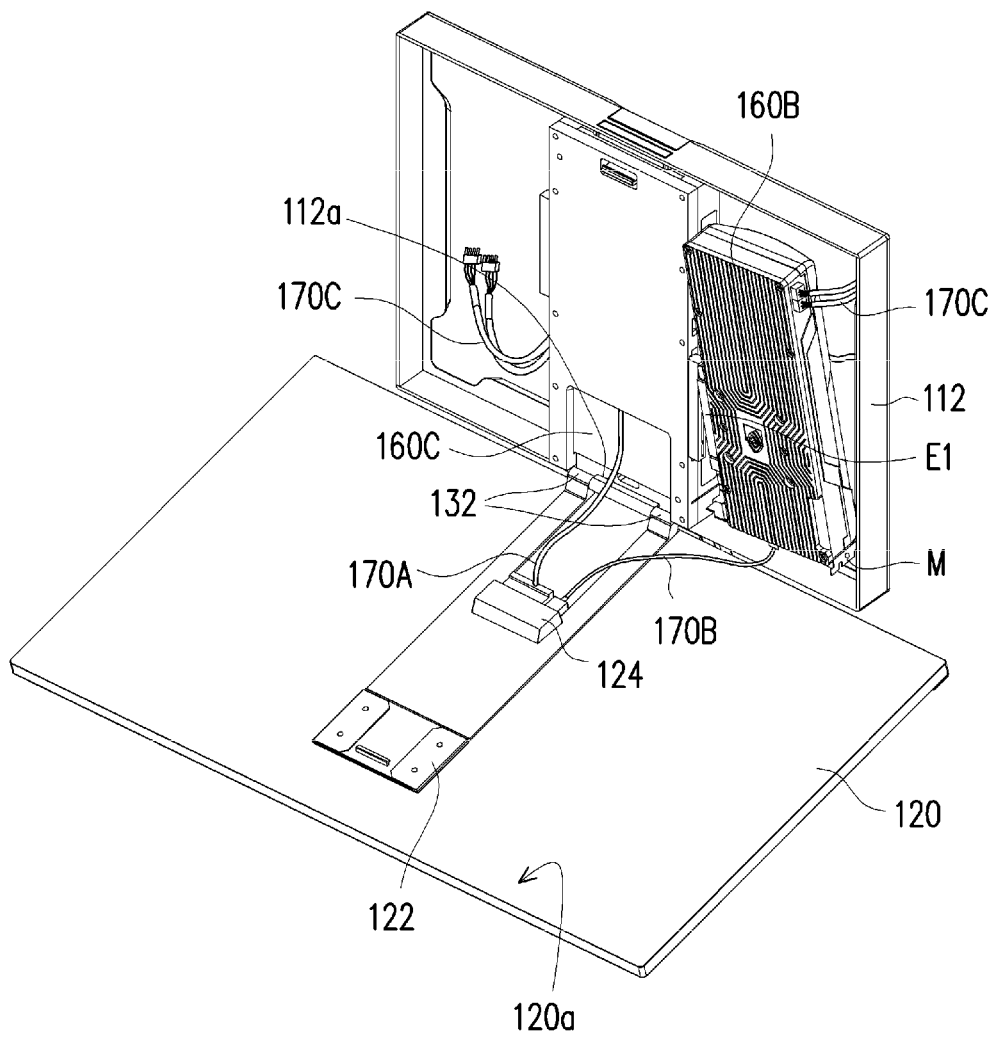
FIG. 4 illustrates the electrical connection of the display and electronic assembly of FIG. 2.

It should be noted that the electrical connection cable 170A shown in FIG. 3A to FIG. 3F is for illustration purposes only, and the electronic device 100 may include more electrical connection cables for power and signal transmission. The following is a detailed description with reference to the drawings. FIG. 4 shows the electrical connection between the display and the electronic assembly of FIG. 2. As shown in FIG. 4, the electrical connection portion 124 is, for example, a signal and power integration slot, and the electrical connection cable 170A plugged into the electrical connection portion 124 is a power cable, which is connected to the second casing part 110b as shown in FIG. 3A. The display 120 receives the required power from external power source connected to the electronic assembly 160A through the electrical connection cable 170A and the electronic assembly 160C. The electronic assembly 160C in the main casing 112 is, for example, a control circuit board of the aforementioned display card (i.e., the electronic assembly 160B), and the electrical connection portion 124 of the display 120 is connected to the electronic assembly 160B through an electrical connection cable 170B. The electronic assembly 160B is plugged into the electronic assembly 160C through a plug terminal E1. The electronic assembly 160C is connected to the electronic assembly 160A in the second casing part 110b through another electrical connection cable 170D shown in FIG. 2. The electrical connection cable 170B and the electrical connection cable 170D are signal cables, so that the display 120 and the electronic assembly 160A transmit signals through the electrical connection cable 170B, the electronic assembly 160B, the electronic assembly 160C, and the electrical connection cable 170D. In addition, the electronic assembly 160B is connected to the electronic assembly 160A in the second casing part 110b through at least one electrical connection cable 170C, and the electrical connection cable 170C is a power cable, so that the electronic assembly 160B can receive the required power from an external power source connected to the electronic assembly 160A through the electrical connection cable 170C.

Figure 5A:
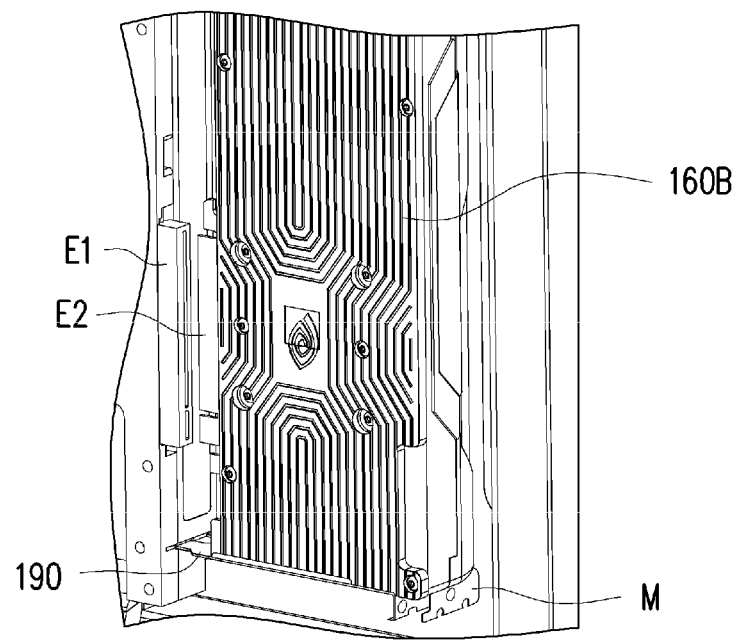
FIG. 5A and FIG. 5B are assembly flowcharts of the electronic assembly of FIG. 4.
Figure 5B:
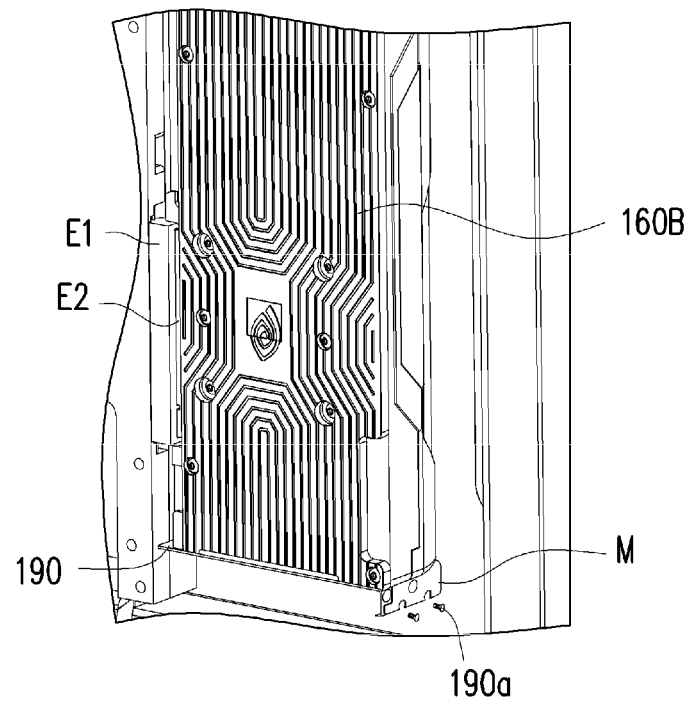

FIG. 5A and FIG. 5B illustrate the assembly process of the electronic assembly of FIG. 4. When the user wishes to assemble the electronic assembly 160B to the main casing 112, the display 120 may be first flipped down from the main casing 112 as shown in FIG. 4 (i.e., the second state shown in FIG. 3D), and the electrical connection cables 170C and electrical connection cables 170B are plugged into the electronic assembly 160B. Then, the assembly part M of the electronic assembly 160B is assembled by sliding the assembly part M along the bracket 190 as shown in FIGS. 5A to 5B, and the assembly part M is fastened to the bracket 190 by fasteners 190a (e.g., screws). In the process, the plug terminal E1 of the electronic assembly 160B is then plugged into the plug terminal E2 of the electronic assembly 160C.

With the above configuration, the display card (the electronic assembly 160B) can be easily detached, allowing the user to configure single or dual display cards as required and facilitate the replacement of the display card. In addition, since the display card (the electronic assembly 160B) and the motherboard (the electronic assembly 160A) are configured in the main casing 112 and the base (the second casing part 110B) respectively, it can avoid the two heat-generating components (the graphics card and the motherboard) getting too close to each other, which increases the difficulty of heat dissipation design.

In FIG. 3A to FIG. 3F, the connection relationship between the electrical connection cable and the electronic assembly 160A is only for illustration. Practically, the electronic assembly 160A has a signal and power integration slot 160A1 as shown in FIG. 2, and the first casing part 110a has an electrical connection portion 114a1 at the extended portion 114a of the stand 114. The electrical connection portion 114a1 is a signal and power integration connector and is suitable for being plugged into the signal and power integration slot 160A1. The electrical connection cable 170A shown in FIG. 3A to FIG. 3F and FIG. 4, the electrical connection cable 170D shown in FIG. 2 and the electrical connection cable 170C shown in FIG. 4 are connected to the electrical connection portion 114a1 shown in FIG. 2, so as to electrically connected to the electronic assembly 160A through the electrical connection portion 114a1 and the signal and power integration slot 160A1.

Figure 7:
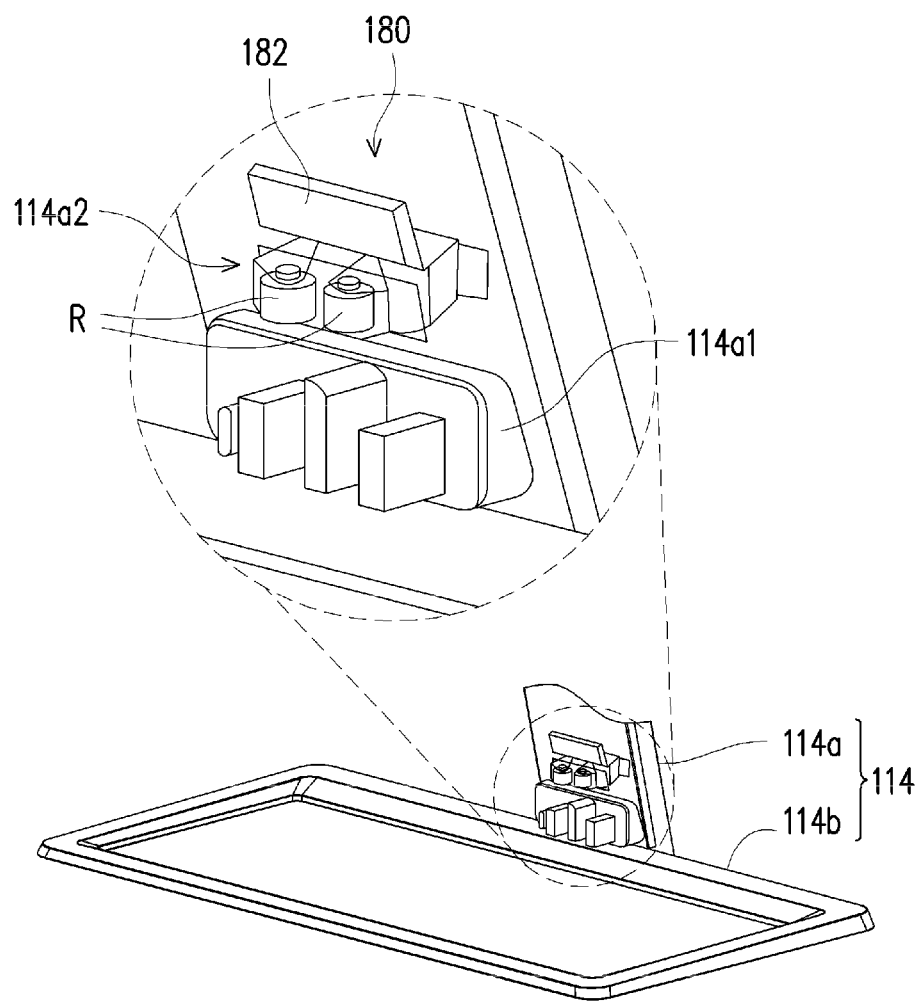
FIG. 7 is a partial perspective view of the stand of FIG. 1.

FIG. 6A to FIG. 6D illustrates the operation process of the second casing part of FIG. 1. FIG. 7 is a partial perspective view of the stand of FIG. 1. Referring to FIG. 6A and FIG. 7, in the present embodiment, the first casing part 110a has an engaging portion 114a2 at the extended portion 114a of the stand 114. The second casing part 110b is movably connected to the first casing part 110a and is configured to move in relative to the first casing part 110a between a first position shown in FIG. 6A and a second position shown in FIG. 6C. When the second casing part 110b is at the first position, the second casing part 110b is engaged with the engaging portion 114a2 of the first casing part 110a and the electronic assembly 160A is connected to the electrical connection portion 114a1 of the first casing part 110a through the signal and power integration slot 160A1. The user can release the engagement between the second casing part 110b and the engaging portion 114a2 as shown in FIG. 6B, and slide the second casing part 110b to the second position as shown in FIG. 6C to disengage the second casing part 110b from the engaging portion 114a2 of the first casing part 110a, and the signal and power integration slot 160A1 of electronic assembly 160A (shown in FIG. 2) is departed from the electrical connection portion 114a1 of first casing part 110a. Then, the user can partially expose the electronic assembly 160A as shown in FIG. 6D for expansion or repair.

With the above configuration, as long as the engagement between the second casing part 110b and the first casing part 110a is released, the second casing part 110b can be moved to a specific position (i.e., the second position), and the electrical connection between the electronic assembly 160A in the second casing part 110b and the electrical connection portion 114a1 of the first casing part 110a is interrupted to improve the convenience of expanding or repairing the electronic assembly 160A.

Specifically, the second casing part 110b is configured to move in a first direction D1 to be disengaged from the first casing part 110a, and the second casing part 110b is configured to be engaged with the engaging portion 114a2 in a second direction D2 opposite to the first direction D1, and the signal and power integration slot 160A1 of the electronic assembly 160A (shown in FIG. 2) is configured to be connected to the electrical connection portion 114a1 along the second direction D2.

Figure 8:
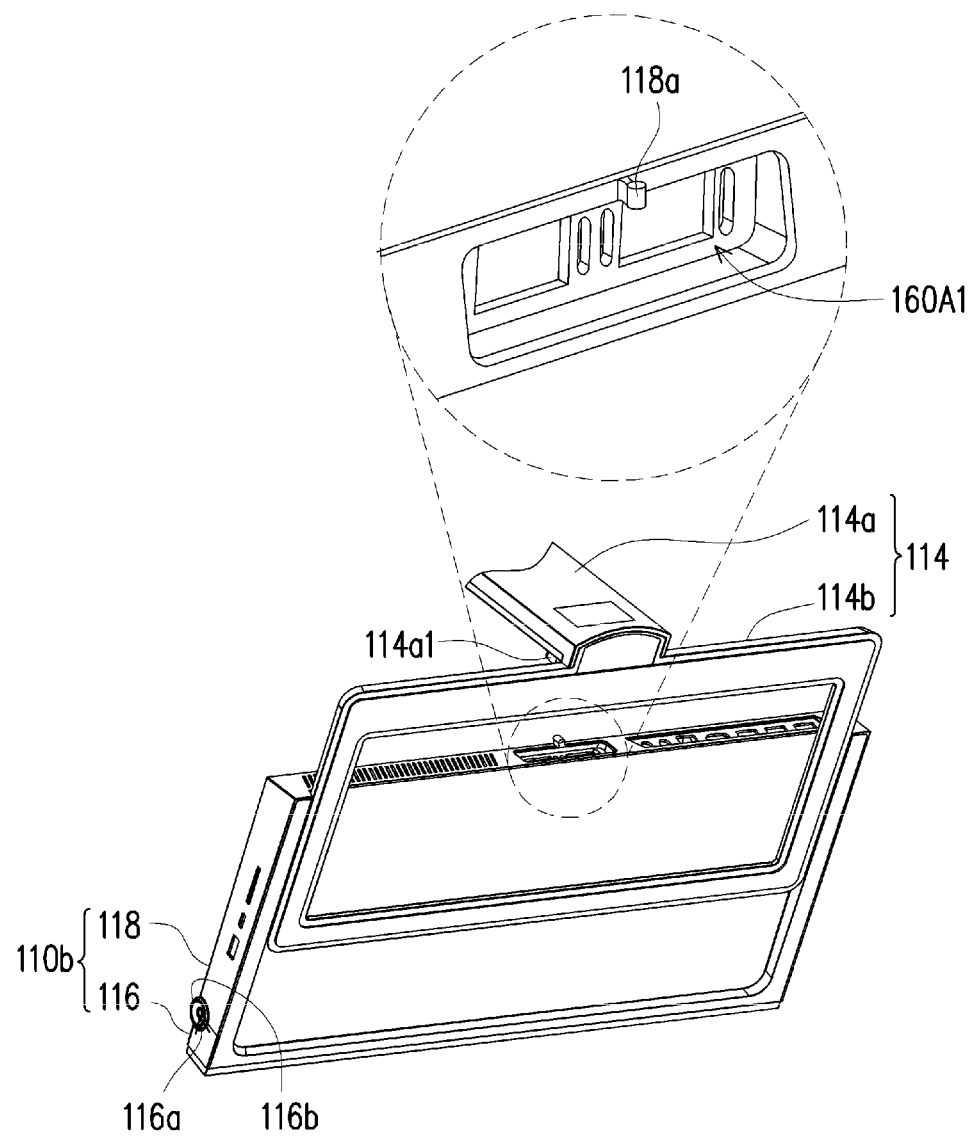
FIG. 8 is a partial perspective view of the electronic device of FIG. 1.

FIG. 8 is a partial perspective view of the electronic device of FIG. 1, which corresponds to the state shown in FIG. 6C. Referring to FIG. 8, the second casing part 110b has a protruding part 118a, and the protruding part 118a is configured to be engaged between the two rollers R of the engaging portion 114a2 shown in FIG. 7. Correspondingly, the electronic device 100 includes a pushing assembly 180, which is movably arranged at the extended portion 114a of the stand 114 of the first casing part 110a and is configured to push the protruding part 118a away from the engaging portion 114a2, as shown in FIG. 6B, to release the engagement between the second casing part 110b and the engaging portion 114a2. Referring to FIG. 6A, in detail, the electronic device 100 further includes an elastic component 150B, the pushing assembly 180 includes a press part 182, a linkage 184, and a push part 186. The linkage 184 is connected between the press part 182 and the push part 186. The elastic component 150B is, for example, a spring and is arranged between the linkage 184 of the pushing assembly 180 and the extended portion 114a of the stand 114. The press part 182 is suitable for being pressed by the user as shown in FIG. 6B and the push part 186 is driven by the linkage 184 against the elastic force of the elastic component 150B to push the protruding part 118a. When the press part 182 is no longer pressed by the user, the pushing assembly 180 is reset by the elastic force of the elastic component 150B as shown in FIG. 6A, FIG. 6C, and FIG. 6D.

In addition, the second casing part 110b of the present embodiment includes a first sub-casing part 116 and a second sub-casing part 118. The second sub-casing part 118 is located between the first sub-casing part 116 and the extended portion 114a of the stand 114. When the second casing part 110b is located at the second position as shown in FIG. 6C, the second sub-casing part 118 is configured to move in the second direction D2 in relative to the first sub-casing part 116 as shown in FIG. 6D, so that an opening area O is formed between the first sub-casing part 116 and the second sub-casing part 118. The opening area O exposes at least a part of the electronic assembly 160A, so that the user can expand or repair the electronic assembly 160A through the opening area O.

In the present embodiment, the first sub-casing part 116 of the second casing part 110b is provided with an audio output jack 116a, which is coupled to the electronic assembly 160A and is used for the audio devices (e.g., various types of speakers). The audio output jack 116a is further provided with a knob 116b, for example, the knob 116b is used to control the audio volume. In other embodiments, the second casing part 110b may be provided with other types of signal input/output devices, which is not limited in the present application.

Figure 9:
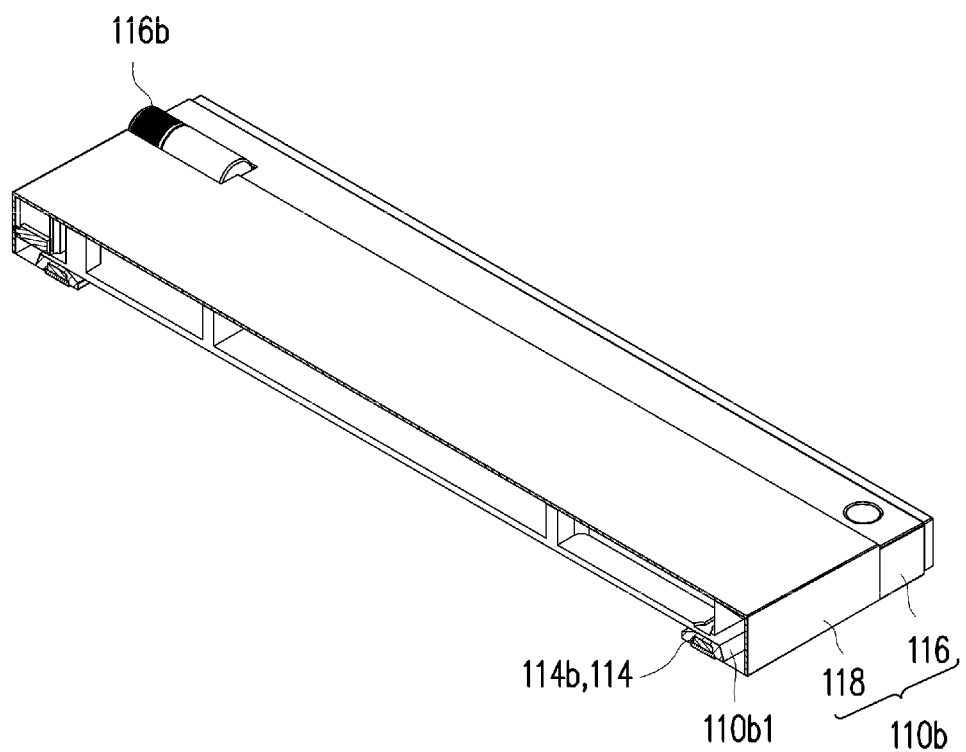
FIG. 9 is a partial perspective view of the second casing part and the stand of FIG. 1 from another perspective.

FIG. 9 is a partial perspective view of the second casing part and the stand of FIG. 1 from another perspective. In the present embodiment, the second casing part 110b has at least one slide rail 110b1 and slides on the based portion 114b of the stand 114 of the first casing part 110a through the slide rail 110b1. In other embodiments, the second casing part 110b can be slid on the first casing part 110a through other applicable manners, which is not limited in the present application.

Accordingly, in the electronic device of the present application, the display can be detached from the main body after being rotated to a specific state in relative to the main body, and thus the convenience of replacing or repairing the display can be improved. Furthermore, as long as the engagement between the second casing part and the first casing part is released, the second casing part can be moved to a specific position to interrupt the electrical connection between the electronic assembly in the second casing part and the electrical connection portion of the first casing part, to facilitate expansion or repair of the electronic assembly.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. An electronic device, comprising:
   a main body;
   a frame, pivotally connected to the main body; and
   a display, detachably assembled to the frame and configured to rotate between a first state and a second state in relative to the main body with the frame, wherein when the display is rotated in relative to the main body to the first state, the display closes the main body, and when the display is rotated in relative to the main body to the second state, the display is departed from the main body, so as to be detached from the main body and the frame.

2. The electronic device as claimed in claim 1, wherein the display has a first assembly portion and the frame has a second assembly portion, the first assembly portion and the second assembly portion are detachably assembled with each other, and when the display is in the first state, the first assembly portion and the second assembly portion are concealed between the display and the main body, and when the display is in the second state, the first assembly portion and the second assembly portion are exposed.

3. The electronic device as claimed in claim 2, wherein the first assembly portion is located on a back surface of the display, and when the display is in the first state, the back surface faces the main body.

4. The electronic device as claimed in claim 1, wherein the display is configured to slide in relative to the frame along a sliding direction to depart from the frame, and the sliding direction is perpendicular to a pivot axis between the frame and the main body.

5. The electronic device as claimed in claim 1, further comprising a locking member, wherein the locking member is disposed in the main body, the frame has an engaging portion, and when the display is in the first state, the locking member and the engaging portion are engaged with each other to limit the frame and the display to the first state.

6. The electronic device as claimed in claim 5, wherein the locking member is pivotally connected to the main body, and the locking member is configured to rotate in relative to the main body, to be engaged with or departed from the engaging portion.

7. The electronic device as claimed in claim 5, further comprising an elastic component, wherein the elastic component is disposed between the locking member and the main body, the locking member is configured to be engaged with the engaging portion by the elastic force of the elastic component, and the locking member is configured to resist against the elastic force of the elastic component and departed from the engaging portion.

8. The electronic device as claimed in claim 1, wherein the display has an electrical connection portion, the electronic device comprises an electronic assembly, the electronic assembly is disposed in the main body, and the display is electrically connected to the electronic assembly through the electrical connection portion, and when the display is in the first state, the electrical connection portion is concealed between the display and the main body, and when the display is in the second state, the electrical connection portion is exposed.

9. The electronic device as claimed in claim 8, further comprising at least one electrical connection cable, wherein the at least one electrical connection cable is connected between the electrical connection portion and the electronic assembly.

10. The electronic device as claimed in claim 8, wherein the electrical connection portion is a signal and power integration slot, and the at least one electrical connection cable comprises a signal cable and a power cable.

11. The electronic device as claimed in claim 1, further comprising an electronic assembly and a bracket, wherein the electronic assembly has an assembly part, the bracket is installed in the main body, and the electronic assembly is detachably mounted to the bracket through the assembly part and located in the main body.

12. The electronic device as claimed in claim 11, wherein the electronic assembly is a display card.

13. The electronic device as claimed in claim 11, wherein when the display is in the first state, the bracket is concealed between the display and the main body, and when the display is in the second state, the bracket is exposed.

14. The electronic device as claimed in claim 11, wherein the main body comprises a main casing and a base, the main casing is supported on the base, the display is rotatably connected to the main casing, the electronic device comprises another electronic assembly, and the two electronic assemblies are located in the main casing and the base, respectively.

15. The electronic device as claimed in claim 1, wherein the electronic device is an All-In-One (AIO) computer.

* * * * *